(12) United States Patent
Negley (10) Patent No.: US 8,994,045 B2
(45) Date of Patent: Mar. 31, 2015

(54) LIGHTING DEVICE HAVING LUMINESCENT MATERIAL BETWEEN A REFLECTIVE CUP AND A SOLID STATE LIGHT EMITTER

(75) Inventor: Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/870,679

(22) Filed: Oct. 11, 2007

(65) Prior Publication Data
US 2008/0089053 A1 Apr. 17, 2008

Related U.S. Application Data

(60) Provisional application No. 60/851,230, filed on Oct. 12, 2006.

(51) Int. Cl.
*H01L 33/00* (2010.01)
*H01L 33/50* (2010.01)

(52) U.S. Cl.
CPC ............... *H01L 33/505* (2013.01); *H01L 33/50* (2013.01); *H01L 33/502* (2013.01); *H01L 33/507* (2013.01); *H01L 33/508* (2013.01); *H01L 33/504* (2013.01)
USPC ........ 257/98; 257/99; 257/100; 257/E33.061; 257/E33.059

(58) Field of Classification Search
CPC ... H01L 33/502; H01L 33/507; H01L 33/504; H01L 33/505; H01L 33/50; H01L 33/508
USPC ...................... 257/82, 81, E33.055, E33.056, 257/E33.059, E33.06, E33.061, 79, 80, 257/E33.058, E33.053, E33.59, 98–100; 362/84; 438/27, 29; 313/498, 499, 313/501–504
See application file for complete search history.

(56) References Cited

U.S. PATENT DOCUMENTS

| 5,210,051 | A | 5/1993 | Carter, Jr. | |
| 6,345,903 | B1 * | 2/2002 | Koike et al. | 362/241 |
| 6,747,406 | B1 | 6/2004 | Bortscheller et al. | |
| 6,774,401 | B2 * | 8/2004 | Nakada et al. | 257/82 |

(Continued)

FOREIGN PATENT DOCUMENTS

| CN | 2708509 Y | 7/2005 |
| CN | 1665038 A | 9/2005 |

(Continued)

OTHER PUBLICATIONS

U.S. Appl. No. 11/613,692, filed Dec. 20, 2006.

(Continued)

*Primary Examiner* — Eva Y Montalvo
*Assistant Examiner* — Diana C Vieira
(74) *Attorney, Agent, or Firm* — Burr & Brown, PLLC (57) ABSTRACT

A lighting device comprising a light emitter chip, a reflective cup and a lumiphor positioned between the chip and the cup. Also, a lighting device comprising a light emitter chip, a wire bonded to a first surface of the chip and a lumiphor which faces a second surface of the chip. Also, a lighting device comprising a light emitter chip, and a lumiphor, a first surface of the chip facing a first region of the lumiphor, a second surface of the chip facing a second region of the lumiphor. Also, a lighting device comprising a light emitter chip and first and second lumiphors, a first surface of the chip facing the second lumiphor, a second surface of the chip facing the first lumiphor. Also, methods of making lighting devices.

25 Claims, 2 Drawing Sheets

(56) References Cited

U.S. PATENT DOCUMENTS

| | | | |
|---|---|---|---|
| 6,914,267 B2 | 7/2005 | Fukasawa et al. | |
| 7,019,335 B2 | 3/2006 | Suenaga | |
| 7,029,935 B2 * | 4/2006 | Negley et al. | 438/29 |
| 7,213,940 B1 | 5/2007 | Van De Ven et al. | |
| 7,233,106 B2 * | 6/2007 | Lee et al. | 313/512 |
| 7,350,933 B2 * | 4/2008 | Ng et al. | 362/84 |
| 7,497,581 B2 * | 3/2009 | Beeson et al. | 362/84 |
| 7,501,749 B2 * | 3/2009 | Takeda et al. | 313/487 |
| 7,550,777 B2 * | 6/2009 | Kato et al. | 257/99 |
| 7,638,809 B2 * | 12/2009 | Ohba | 257/97 |
| 7,737,621 B2 * | 6/2010 | Masuda et al. | 313/501 |
| 2002/0070681 A1 | 6/2002 | Shimizu et al. | |
| 2002/0163302 A1 * | 11/2002 | Nitta et al. | 313/512 |
| 2003/0002272 A1 * | 1/2003 | Suehiro et al. | 362/84 |
| 2003/0038295 A1 | 2/2003 | Koda | |
| 2004/0150991 A1 * | 8/2004 | Ouderkirk et al. | 362/231 |
| 2005/0041010 A1 * | 2/2005 | Komoto et al. | 345/102 |
| 2005/0127833 A1 | 6/2005 | Tieszen | |
| 2005/0280354 A1 * | 12/2005 | Liu | 313/502 |
| 2006/0012298 A1 * | 1/2006 | Lee et al. | 313/512 |
| 2006/0099449 A1 * | 5/2006 | Amano et al. | 428/690 |
| 2006/0124953 A1 * | 6/2006 | Negley et al. | 257/99 |
| 2006/0231847 A1 * | 10/2006 | Lee et al. | 257/82 |
| 2007/0051966 A1 * | 3/2007 | Higashi et al. | 257/98 |
| 2007/0080636 A1 * | 4/2007 | Lee | 313/512 |
| 2008/0191227 A1 * | 8/2008 | Kimura et al. | 257/98 |
| 2009/0045422 A1 * | 2/2009 | Kato et al. | 257/98 |

FOREIGN PATENT DOCUMENTS

| | | |
|---|---|---|
| EP | 1 160 883 | 12/2001 |
| EP | 1 780 592 | 5/2007 |
| WO | 02/089219 | 11/2002 |
| WO | 2006/003931 | 1/2006 |

OTHER PUBLICATIONS

U.S. Appl. No. 11/614,180, filed Dec. 21, 2006.
U.S. Appl. No. 11/613,714, filed Dec. 20, 2006.
U.S. Appl. No. 11/613,733, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/737,321, filed Apr. 19, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/951,626, filed Dec. 6, 2007.
U.S. Appl. No. 12/035,604, filed Feb. 22, 2008.
U.S. Appl. No. 11/947,323, filed Nov. 29, 2007.
Taiwan Office Action (and translation provided by foreign counsel) from a corresponding Taiwan patent application bearing a mailing date of May 22, 2013, 8 pages.

* cited by examiner

LIGHTING DEVICE HAVING LUMINESCENT MATERIAL BETWEEN A REFLECTIVE CUP AND A SOLID STATE LIGHT EMITTER

CROSS-REFERENCE TO RELATED APPLICATIONS

This application claims the benefit of U.S. Provisional Patent Application No. 60/851,230, filed Oct. 12, 2006, the entirety of which is incorporated herein by reference.

FIELD OF THE INVENTION

The present invention is directed to lighting devices which include at least one LED (light emitting diode) chip and at least one lumiphor. The present invention is also directed to methods of making lighting devices which include at least one LED (light emitting diode) chip and at least one lumiphor.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), and/or duration of service.

A variety of solid state light emitters are well-known. For example, one type of solid state light emitter is a light emitting diode.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met.

For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

The blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Light emitting diodes can be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (lm/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished in a variety of ways, one representative way being by adding the luminescent materials to a clear or translucent encapsulant material (e.g., epoxy-based, silicone-based, glass-based or metal oxide based material) as discussed above, for example by a blending or coating process.

For example, one representative example of a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. The first resin portion can be obtained by filling the cup reflector with a resin material and curing it after the light emitting diode chip has been mounted onto the bottom of the cup reflector and then has had its cathode and anode regions electrically connected to the respective leads by way of wires. A luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

There is an ongoing need for ways to use solid state light emitters, e.g., light emitting diodes, in a wider variety of applications, with greater energy efficiency, with improved color rendering index (CRI Ra), with improved efficacy (lm/W), and/or with longer duration of service.

BRIEF SUMMARY OF THE INVENTION

Figure 1:
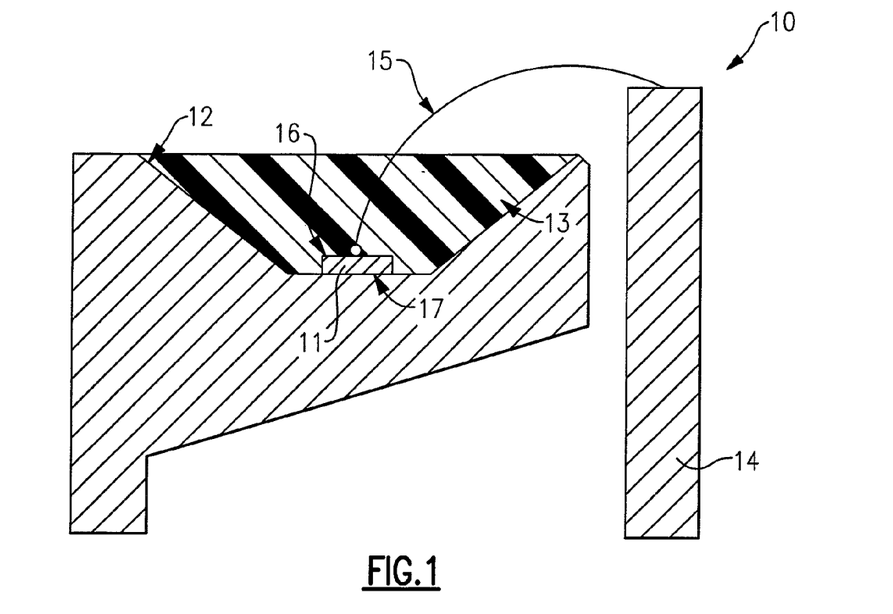
FIG. 1 depicts a conventional LED package which includes an LED chip and a lumiphor.

FIG. 1 depicts a conventional LED package which includes an LED chip and a lumiphor. Referring to FIG. 1, the LED package 10 includes an LED chip 11 mounted on a reflective cup 12, with a lumiphor 13 (comprising a binder material and a luminescent material dispersed in the binder material) deposited in the reflective cup 12 and covering the LED chip 11. A leadframe includes the reflective cup 12 which is integral with one lead, and a second lead 14, the respective leads carrying opposite electrical charge. The leadframe is electrically connected to circuitry. A wire 15 electrically connects the second lead 14 to a first surface 16 of the LED chip 11, and a second surface 17 of the LED chip 11 is in contact with the reflective cup 12. Such conventional LED packages are made by Nichia, Cree and Osram, for example, and are typically referred to as "glob approach" devices, as a glob of phosphor/resin (epoxy or silicone resin for example) is globbed about the chip in the "reflector" cup of the LED package.

In the case of conventional LED packages as described above, a significant proportion (e.g., in many cases, as much as 20% to 25%) of the excitation light (i.e., light from the LED) is reflected (back-scattered) from the lumiphor back into the light emitting diode chip/package. Back-scattered light which is scattered back into the light emitting diode chip itself has a very low probability of coming out of the chip, and hence, such back-scattering results in a system loss of energy.

In addition, the lumiphor-converted light is omni-directional, so that in general, 50% of the light is directed back to the LED source.

Furthermore, the thicker the luminescent element is, and the greater the luminescent material (e.g., phosphor) content in the luminescent element, the greater the amount of self-absorption that will occur. Self-absorption occurs when light emissions within the packaging layer stay within the packaging layer to excite other lumiphor particles and eventually are absorbed or are otherwise prevented from exiting the device, thus reducing performance (intensity) and efficiency. Additionally, the larger the particle size of the luminescent material (e.g., phosphors), the greater the extent that the particles of luminescent material can cause scattering of both the light from the LED chip and the light generated by the lumiphor.

According to a first aspect of the present invention, there is provided a lighting device comprising:
  a reflective cup;
  at least a first solid state light emitter chip; and
  at least first and second lumiphors,
  the first solid state light emitter chip having first and second solid state light emitter chip surfaces on opposite sides;
  the first lumiphor having a first lumiphor first surface and a first lumiphor second surface;
  the first solid state light emitter chip first surface facing the second lumiphor,
  the first solid state light emitter chip second surface being in contact with the first lumiphor first surface,
  the first lumiphor second surface being in contact with the reflective cup.

In some embodiments according to the first aspect of the present invention, the device further comprises at least one wire bonded to the first solid state light emitter chip first surface.

In some embodiments according to the first aspect of the present invention, the second lumiphor is spaced from the first solid state light emitter chip first surface.

According to a second aspect of the present invention, there is provided a lighting device comprising:
  at least a first solid state light emitter chip;
  at least a first reflective cup; and
  at least a first lumiphor, the first lumiphor being positioned between the first solid state light emitter chip and the first reflective cup.

In some embodiments according to the second aspect of the present invention:
  the device further comprises at least a second lumiphor, a first surface of the first solid state light emitter chip faces the second lumiphor, and a second surface of the first solid state light emitter chip faces the first lumiphor.

In some embodiments according to the second aspect of the present invention, the device further comprises a reflective cup, a surface of the first lumiphor being in contact with the reflective cup.

In some embodiments according to the second aspect of the present invention, the device further comprises at least one wire bonded to the first solid state light emitter chip first surface.

In some embodiments according to the second aspect of the present invention, the first lumiphor surrounds the first solid state light emitter chip.

In some embodiments according to the second aspect of the present invention, a first surface of the first solid state light emitter chip faces a first region of the first lumiphor and a second surface of the first solid state light emitter chip faces a second region of the first lumiphor.

According to a third aspect of the present invention, there is provided a lighting device comprising:

at least a first solid state light emitter chip;

at least one wire bonded to a first surface of the first solid state light emitter chip; and at least a first lumiphor, a second surface of the first solid state light emitter chip facing the first lumiphor.

In some embodiments according to the third aspect of the present invention, the device further comprises at least a second lumiphor, the first surface of the first solid state light emitter chip facing the second lumiphor.

In some embodiments according to the third aspect of the present invention, the device further comprises a reflective cup, a surface of the first lumiphor being in contact with the reflective cup.

According to a fourth aspect of the present invention, there is provided a lighting device comprising:

at least a first solid state light emitter chip; and at least a first lumiphor, the first lumiphor surrounding the first solid state light emitter chip.

In some embodiments according to the fourth aspect of the present invention, the device further comprises at least one wire bonded to a first surface of the first solid state light emitter chip.

In some embodiments according to the fourth aspect of the present invention, the device further comprises a reflective cup, a surface of the first lumiphor being in contact with the reflective cup.

According to a fifth aspect of the present invention, there is provided a lighting device comprising:

at least a first solid state light emitter chip; and at least a first lumiphor, a first surface of the first solid state light emitter chip facing a first region of the first lumiphor, a second surface of the first solid state light emitter chip facing a second region of the first lumiphor.

In some embodiments according to the fifth aspect of the present invention, the device further comprises at least one wire bonded to the first solid state light emitter chip first surface.

In some embodiments according to the fifth aspect of the present invention, the device further comprises a reflective cup, the first lumiphor being in contact with the reflective cup.

According to a sixth aspect of the present invention, there is provided a lighting device comprising:

at least a first solid state light emitter chip;

at least first and second lumiphors, the first solid state light emitter chip having a first surface facing the second lumiphor and a second surface facing the first lumiphor.

In some embodiments according to the sixth aspect of the present invention, the device further comprises a reflective cup, a surface of the first lumiphor being in contact with the reflective cup.

In some embodiments according to the sixth aspect of the present invention, the device further comprises at least one wire bonded to the first solid state light emitter chip first surface.

According to a seventh aspect of the present invention, there is provided a method of making a lighting device, the method comprising:

positioning a first lumiphor in a reflective cup;

positioning at least a first solid state light emitter chip such that the first lumiphor is between the reflective cup and the first solid state light emitter chip, and a second surface of the first solid state light emitter chip is in contact with the first lumiphor; and positioning at least a second lumiphor such that a first surface of the solid state light emitter chip faces the second lumiphor, the first solid state light emitter chip first surface and the first solid state light emitter chip second surface being on opposite sides of the first solid state light emitter chip.

In some embodiments according to the seventh aspect of the present invention, the positioning the first lumiphor in a reflective cup comprises depositing in the reflective cup a composition comprising at least one luminescent material and at least one binder.

In some embodiments according to the seventh aspect of the present invention, the method further comprises bonding at least one wire to the first solid state light emitter chip first surface.

According to an eighth aspect of the present invention, there is provided a method of making a lighting device, the method comprising:

positioning a first lumiphor in a reflective cup; and positioning at least a first solid state light emitter chip such that the first lumiphor is between the reflective cup and the first solid state light emitter chip.

In some embodiments according to the eighth aspect of the present invention, the positioning the first lumiphor in a reflective cup comprises depositing in the reflective cup a composition comprising at least one luminescent material and at least one binder.

In some embodiments according to the eighth aspect of the present invention, the method further comprises bonding at least one wire to the first solid state light emitter chip first surface.

According to a ninth aspect of the present invention, there is provided a method of making a lighting device, the method comprising:

positioning at least a first solid state light emitter chip such that a second surface of the solid state light emitter chip faces a first lumiphor; and bonding at least one wire to a first surface of the first solid state light emitter chip.

In some embodiments according to the ninth aspect of the present invention, the method further comprises positioning at least a second lumiphor such that a first surface of the first solid state light emitter chip faces the second lumiphor.

In some embodiments according to the ninth aspect of the present invention, the method further comprises positioning the first lumiphor in a reflective cup prior to positioning the first solid state light emitter chip such that a second surface of the solid state light emitter chip faces a first lumiphor. In some such embodiments, the positioning the first lumiphor in a reflective cup comprises depositing in the reflective cup a composition comprising at least one luminescent material and at least one binder.

According to a tenth aspect of the present invention, there is provided a method of making a lighting device, the method comprising:

positioning at least a first solid state light emitter chip such that a second surface of the solid state light emitter chip faces a first portion of a first lumiphor and a first surface of the solid state light emitter chip faces a second portion of the first lumiphor.

In some embodiments according to the tenth aspect of the present invention, the method further comprises bonding at least one wire to the first solid state light emitter chip first surface.

In some embodiments according to the tenth aspect of the present invention, the method further comprises positioning the first lumiphor in a reflective cup prior to positioning the first solid state light emitter chip such that a second surface of the solid state light emitter chip faces a first lumiphor. In some such embodiments, the positioning the first lumiphor in a reflective cup comprises depositing in the reflective cup a composition comprising at least one luminescent material and at least one binder.

According to an eleventh aspect of the present invention, there is provided a method of making a lighting device, the method comprising:

positioning at least a first solid state light emitter chip such that a second surface of the solid state light emitter chip faces a first lumiphor;

positioning at least a second lumiphor such that a first surface of the solid state light emitter chip faces the second lumiphor.

In some embodiments according to the eleventh aspect of the present invention, the method further comprises positioning the first lumiphor in a reflective cup prior to positioning the first solid state light emitter chip such that a second surface of the solid state light emitter chip faces a first lumiphor. In some such embodiments, the positioning the first lumiphor in a reflective cup comprises depositing in the reflective cup a composition comprising at least one luminescent material and at least one binder.

In some embodiments according to the eleventh aspect of the present invention, the method further comprises bonding at least one wire to the first solid state light emitter chip first surface.

In some embodiments according to the present invention:

the first solid state light emitter chip, if illuminated, would emit light having a peak wavelength in the range of from 430 nm to 480 nm;

the first lumiphor, if excited, would emit light having a dominant wavelength in the range of from about 555 nm to about 585 nm;

if the first solid state light emitter chip is illuminated, a mixture of light emitted by the first solid state light emitter chip and light emitted by the first lumiphor would, in an absence of any additional light, have a mixed light illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

The present invention is directed to devices and methods which minimize the quantity of back-reflected light and re-extract back-reflected light on the first few "bounces' within the chip/dice.

The invention may be more fully understood with reference to the accompanying drawings and the following detailed description of the invention.

DETAILED DESCRIPTION OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present invention further relates to an illuminated enclosure (the volume of which can be illuminated uniformly or non-uniformly), comprising an enclosed space and at least one lighting device according to the present invention, wherein the lighting device illuminates at least a portion of the enclosure (uniformly or non-uniformly).

The present invention is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "the first lumiphor surrounds the first solid state light emitter chip", and the like, as used herein, means that the first lumiphor encompasses the first solid state light emitter chip three-dimensionally (and is not necessarily in contact with the first solid state light emitter chip), i.e., in order for light emitted by the first solid state light emitter chip to escape the lighting device, such light must pass through the first lumiphor.

The expression "mounted on", as used herein, means that the first structure which is "mounted on" a second structure can be in contact with the second structure, or can be separated from the second structure by one or more intervening structures (each side, of opposite sides, of which is in contact with the first structure, the second structure or one of the intervening structures).

The expression "in contact with", as used in the present specification (including in the preceding paragraph), means that the first structure which is "in contact with" a second structure can be in direct contact with the second structure, or can be separated from the second structure by one or more intervening structures (i.e., in indirect contact), where the first and second structures, and the one or more intervening structures each have at least one surface which is in direct contact with another surface selected from among surfaces of the first and second structures and surfaces of the one or more intervening structures.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, in some aspects, the present invention provides a lighting device which comprises at least a first solid state light emitter chip and at least a first phosphor. In some embodiments, the lighting devices further comprise at least one reflective cup and/or at least one wire.

Any desired solid state light emitter chip or chips, e.g., an LED chip or LED chips, can be employed in accordance with the present invention. Persons of skill in the art are aware of, and have ready access to, a wide variety of such solid state light emitter chips. Such solid state light emitter chips include inorganic and organic light emitters, a variety of each of which are well-known in the art (and therefore it is not necessary to describe in detail such devices, and/or the materials out of which such devices are made).

Where more than one solid state light emitter chips are present, the respective solid state light emitter chips can be similar to one another, different from one another or any combination.

Representative examples of suitable LEDs are described in:

(1) U.S. Patent Application No. 60/753,138, filed on Dec. 22, 2005, entitled "Lighting Device" (inventor: Gerald H. Negley), the entirety of which is hereby incorporated by reference, and U.S. patent application Ser. No. 11/614,180, filed Dec. 21, 2006;

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven), the entirety of which is hereby incorporated by reference, and U.S. patent application Ser. No. 11/624,811, filed Jan. 19, 2007;

(3) U.S. Patent Application No. 60/808,702, filed on May 26, 2006, entitled "Lighting Device" (inventors: Gerald H. Negley and Antony Paul van de Ven), the entirety of which is hereby incorporated by reference, and U.S. patent application Ser. No. 11/751,982, filed May 22, 2007;

(4) U.S. Patent Application No. 60/808,925, filed on May 26, 2006, entitled "solid state Light Emitting Device and Method of Making Same" (inventors: Gerald H. Negley and Neal Hunter), the entirety of which is hereby incorporated by reference, and U.S. patent application Ser. No. 11/753,103, filed May 24, 2007;

(5) U.S. Patent Application No. 60/802,697, filed on May 23, 2006, entitled "Lighting Device and Method of Making" (inventor: Gerald H. Negley), the entirety of which is hereby incorporated by reference, and U.S. patent application Ser. No. 11/751,990, filed May 22, 2007;

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference;

(8) U.S. Patent Application No. 60/851,230, filed on Oct. 12, 2006, entitled "LIGHTING DEVICE AND METHOD OF MAKING SAME" (inventor: Gerald H. Negley, the entirety of which is hereby incorporated by reference.

In some embodiments, the solid state light emitter chip comprises a substrate made of sapphire (e.g., a sapphire based InGaN chip, in which, for example, a GaN-based LED structure is grown on a sapphire chip). Such an solid state light emitter chip is especially suitable for use as a lateral (non-vertical) chip (i.e., a chip in which the positive and negative electrical connections are not made on opposite sides of the chip, e.g., they are both made on one side of the chip), as typical phosphors for making "phosphor converted" LEDs (PC-LEDs) have an index of refraction similar to that of the sapphire substrate. In such embodiments, it is believed that owing to the fact that the phosphor has a similar index of refraction as the sapphire, the extraction (with minimal reflection) is improved (for the blue light). The reflection coefficient, R, is equal to $(n_1^2-n_2^2)/(n_1^2+n_2^2)$, where the total reflection is the square of this coefficient (e.g., $R^2+T^2=1$, assuming no absorption).

In some embodiments of the present invention, the first solid state light emitter chip has a first solid state light emitter chip first surface and a first solid state light emitter chip second surface, and the first solid state light emitter chip first surface and the first solid state light emitter chip second surface are on opposite sides of the first solid state light emitter chip. By "opposite" is meant that a first plane, which includes at least three points on the first surface, and a second plane, which includes at least three points on the second surface, define an angle of not more than 20 degrees (i.e., a line on the first plane which is perpendicular to a line along which the first plane intersects, if at all, the second plane, and a line on the second plane which is also perpendicular to that line, define an angle of not more than 20 degrees).

The expression "lumiphor", as used herein, refers to any luminescent element, i.e., any element which includes a luminescent material.

The lumiphor or lumiphors can individually be any lumiphor, a wide variety of which are known to those skilled in the art. For example, the one or more luminescent materials in the lumiphor can be selected from among phosphors, scintillators, day glow tapes, inks which glow in the visible spectrum upon illumination with ultraviolet light, etc. The one or more luminescent materials can be down-converting or up-converting, or can include a combination of both types. For example, the first lumiphor can comprise one or more down-converting luminescent materials.

The (or each of the) lumiphor(s) can, if desired, further comprise one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). In general, the thicker the lumiphor, the lower the weight percentage of the phosphor can be, i.e., depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure).

The (or each of the) lumiphor(s) can, independently, further comprise any of a number of well-known additives, e.g., diffusers, scatterers, tints, etc.

Representative examples of suitable lumiphors are described in the patent applications referred to above and incorporated herein by reference, and in U.S. Patent Application No. 60/839,453, filed on Aug. 23, 2006, entitled "LIGHTING DEVICE AND LIGHTING METHOD" (inventors: Antony Paul van de Ven and Gerald H. Negley, and U.S. patent application Ser. No. 11/843,243, filed Aug. 22, 2007, the entireties of which are hereby incorporated by reference.

As noted above, in some embodiments according to the present invention, one or more lumiphors are spaced from one or more solid state light emitter chips. Representative examples of spacings, and relative spacings based on geometrical considerations, are described in U.S. Patent Application No. 60/753,138 (discussed above), filed on Dec. 22, 2005, entitled "Lighting Device" (inventor: Gerald H. Negley) and U.S. patent application Ser. No. 11/614,180, filed Dec. 21, 2006, the entireties of which are hereby incorporated by reference.

In addition, as noted above, in some embodiments according to the present invention, a size of a surface (or surfaces) of a lumiphor (or more than one lumiphor) which faces (in parallel or not in parallel) a surface (or surfaces) of an solid state light emitter chip (or more than one solid state light emitter chip) relative to the facing area of the solid state light emitter chip surface is as described in U.S. Patent Application No. 60/753,138 (discussed above), filed on Dec. 22, 2005, entitled "Lighting Device" (inventor: Gerald H. Negley) and U.S. patent application Ser. No. 11/614,180, filed Dec. 21, 2006, the entireties of which are hereby incorporated by reference. For example, in some embodiments, the surface area of the illumination surface of the solid state light emitter which faces the luminescent element is much smaller than the surface area of the luminescent element which faces the solid state light emitter, as described in U.S. Patent Application No. 60/753,138, filed on Dec. 22, 2005.

In some embodiments of the present invention, the first lumiphor first surface and the first lumiphor second surface are on opposite sides of the first lumiphor. Similar to above, by "opposite" is meant that a first plane, which includes at least three points on the first surface, and a second plane, which includes at least three points on the second surface, define an angle of not more than 20 degrees (i.e., a line on the first plane which is perpendicular to a line along which the first plane intersects, if at all, the second plane, and a line on the second plane which is also perpendicular to that line, define an angle of not more than 20 degrees).

In some embodiments of the present invention, the first solid state light emitter chip second surface is in contact with the first lumiphor.

The reflective cup can be of any desired shape, size and material. Persons of skill in the art are aware of, and have ready access to, a wide variety of such suitable shapes, sizes and materials for the reflective cup.

The wire can be any suitable wire, suitable for conducting electricity, a wide variety of which are well-known to those skilled in the art. For example, a suitable wire can be copper wire of an appropriate gauge.

The lighting devices of the present invention can be arranged, mounted and supplied with electricity in any desired manner, and can be mounted on any desired housing or fixture. Skilled artisans are familiar with a wide variety of arrangements, mounting schemes and power supplying apparatuses, and any such arrangements, schemes and apparatuses can be employed in connection with the present invention.

For example, persons skilled in the art are very familiar with a variety of suitable leadframes, some of which comprise a pair of leads, one of which is integral with a reflective cup (as discussed above) which is in contact with a first region of the solid state light emitter chip (i.e., either its anode or its cathode), the other lead being connected to a wire (as discussed above) which is connected to a second region of the solid state light emitter chip (either its anode and cathode, whichever is not in the first region of the solid state light emitter chip).

In addition, any desired circuitry can be employed in order to supply energy to the lighting devices according to the present invention. Representative examples of circuitry which may be used in practicing the present invention is described in:

(1) U.S. Patent Application No. 60/752,753, filed on Dec. 21, 2005, entitled "Lighting Device" (inventors: Gerald H. Negley, Antony Paul van de Ven and Neal Hunter) and U.S. patent application Ser. No. 11/613,692, filed Dec. 20, 2006, the entireties of which are hereby incorporated by reference;

(2) U.S. Patent Application No. 60/798,446, filed on May 5, 2006, entitled "Lighting Device" (inventor: Antony Paul van de Ven) and U.S. patent application Ser. No. 11/743,754, filed May 3, 2007, the entireties of which are hereby incorporated by reference;

(3) U.S. Patent Application No. 60/809,959, filed on Jun. 1, 2006, entitled "Lighting Device With Cooling" (inventors: Thomas G. Coleman, Gerald H. Negley and Antony Paul van de Ven) and U.S. patent application Ser. No. 11/626,483, filed Jan. 24, 2007, the entireties of which are hereby incorporated by reference;

(4) U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007, the entireties of which are hereby incorporated by reference;

(5) U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007, the entireties of which are hereby incorporated by reference.

The lighting devices of the present invention can be electrically connected (or selectively connected) to any desired power source, persons of skill in the art being familiar with a variety of such power sources.

In some embodiments of the present invention, the lighting devices further comprise an encapsulant region. Persons of skill in the art are familiar with, and have easy access to, a wide variety of materials which are suitable for use in making an encapsulant region for a packaged LED, and any such materials can, if desired, be employed. For example, two well-known representative classes of materials out of which the encapsulant region can be constructed include epoxies and silicones.

Persons of skill in the art are also familiar with a wide variety of suitable shapes for the encapsulant region, and the encapsulant region(s) in the device according to the present invention can be of any such shape. Persons of skill in the art are also familiar with various ways to make a packaged device incorporating the various elements described herein in connection with the present invention. Accordingly, further description of materials for use in making the encapsulant region, shapes for the encapsulant region and methods of making the devices described herein is not needed.

In some embodiments according to the present invention, a highly translucent or highly transparent (e.g., a structure which passes at least 80%, or at least 90%, of the incident light) material (e.g., a material which is used as an encapsulant in LED packaging) is positioned between the solid state light emitter chip and a second lumiphor (and/or one or more region of the first lumiphor). For example, persons of skill in the art are familiar with a wide variety of suitable materials, e.g., one or more silicone materials.

The lighting devices according to the present invention can be made by any suitable process, a variety of which will be apparent to those skilled in the art based on the information provided herein.

For example, the following is a description of a representative method for making a lighting device according to the present invention.

A leadframe may be made in any conventional configuration using any conventional techniques. The leadframe is preferably made of metal and may be stamped and optionally post-plated. The leadframe may also undergo optional ultrasonic or other cleaning. The leadframe includes the first and second leads and reflective elements ("cups") for a plurality of LEDs. The reflective elements may be polished or plated to increase their reflectivity.

Next, a first lumiphor composition (comprising binder and luminescent material) is deposited in each of the reflective cups to fill approximately one-third of the depth of the reflective cups, to form first lumiphors in each cup.

Next, for each cup, one or more solid state light emitter chips are placed in the lumiphor composition, either while the first lumiphor composition is curing or after the lumiphor composition has cured (in which case regions must be formed in the cured first lumiphor composition to accommodate the solid state light emitter chips) such that substantially the entireties of all of the surfaces of the solid state light emitter chips, except for their top surfaces, is in contact with the first lumiphor (formed of the first lumiphor composition).

Next, a clear fill composition (e.g., consisting essentially of an epoxy-based, silicone-based, glass-based and/or metal oxide-based material) is deposited in each of the cups to substantially fill the cups, and the clear fill composition is allowed to cure to form a clear fill region.

Next, a second lumiphor composition (which may be the same or different from the first lumiphor composition) is deposited above the entirety of the cured clear fill composition in order to form second lumiphors above each cup.

Next, the leadframe subassembly is inverted and register portions of the leadframe subassembly are inserted into mold cavities formed in a mold.

Next, one or more encapsulant compositions are deposited in the mold to form one or more encapsulant regions. The lighting device can thus consist of a single encapsulant region or multiple encapsulant regions, e.g., as described in U.S. Patent Application No. 60/802,697, filed on May 23, 2006, entitled "Lighting Device and Method of Making" (inventor: Gerald H. Negley) and U.S. patent application Ser. No. 11/751,990, filed May 22, 2007, the entireties of which are hereby incorporated by reference.

Next, the nearly finished leadframe structure is ejected from the mold. An optional post-cure step may then be performed followed by an optional cleaning/deflash step.

Next, singulation is performed, in which the bars are cut away from the finished leadframe assembly.

Persons of skill in the art can readily perform any of the steps described above, and/or known variations thereof. In addition, several of the steps described above are described in U.S. Patent Application No. 60/802,697, filed on May 23, 2006, and U.S. patent application Ser. No. 11/751,990, filed May 22, 2007 (both discussed above).

In general, light of any number of colors can be mixed in the lighting devices according to the present invention, e.g., by selecting specific solid state light emitter chips and luminescent materials. Representative examples of blends of light colors are described in:

(1) U.S. Patent Application No. 60/752,555, filed Dec. 21, 2005, entitled "Lighting Device and Lighting Method" (inventors: Antony Paul Van de Ven and Gerald H. Negley) and U.S. patent application Ser. No. 11/613,714, filed Dec. 20, 2006, the entireties of which are hereby incorporated by reference;

(2) U.S. Patent Application No. 60/752,556, filed on Dec. 21, 2005, entitled "SIGN AND METHOD FOR LIGHTING" (inventors: Gerald H. Negley and Antony Paul van de Ven) and U.S. patent application Ser. No. 11/613,733, filed Dec. 20, 2006, the entireties of which are hereby incorporated by reference;

(3) U.S. Patent Application No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007, the entireties of which are hereby incorporated by reference;

(4) U.S. Patent Application No. 60/793,518, filed on Apr. 20, 2006, entitled "LIGHTING DEVICE AND LIGHTING METHOD" (inventors: Gerald H. Negley and Antony Paul van de Ven) and U.S. patent application Ser. No. 11/736,799, filed Apr. 18, 2007, the entireties of which are hereby incorporated by reference;

(5) U.S. Patent Application No. 60/793,530, filed on Apr. 20, 2006, entitled "LIGHTING DEVICE AND LIGHTING METHOD" (inventors: Gerald H. Negley and Antony Paul van de Ven) and U.S. patent application Ser. No. 11/737,321, filed Apr. 19, 2007, the entireties of which are hereby incorporated by reference;

(6) U.S. Pat. No. 7,213,940, issued on May 8, 2007, entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/868,134, filed on Dec. 1, 2006, entitled "LIGHTING DEVICE AND LIGHTING METHOD" (inventors: Antony Paul van de Ven and Gerald H. Negley), the entirety of which is hereby incorporated by reference;

(8) U.S. Patent Application No. 60/868,986, filed on Dec. 7, 2006, entitled "LIGHTING DEVICE AND LIGHTING METHOD" (inventors: Antony Paul van de Ven and Gerald H. Negley), the entirety of which is hereby incorporated by reference;

(9) U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference; and (10) U.S. Patent Application No. 60/891,148, filed on Feb. 22, 2007, entitled "LIGHTING DEVICE AND METHODS OF LIGHTING, LIGHT FILTERS AND METHODS OF FILTERING LIGHT" (inventor: Antony Paul van de Ven, the entirety of which is hereby incorporated by reference.

Embodiments in accordance with the present invention are described herein with reference to cross-sectional (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Figure 2:
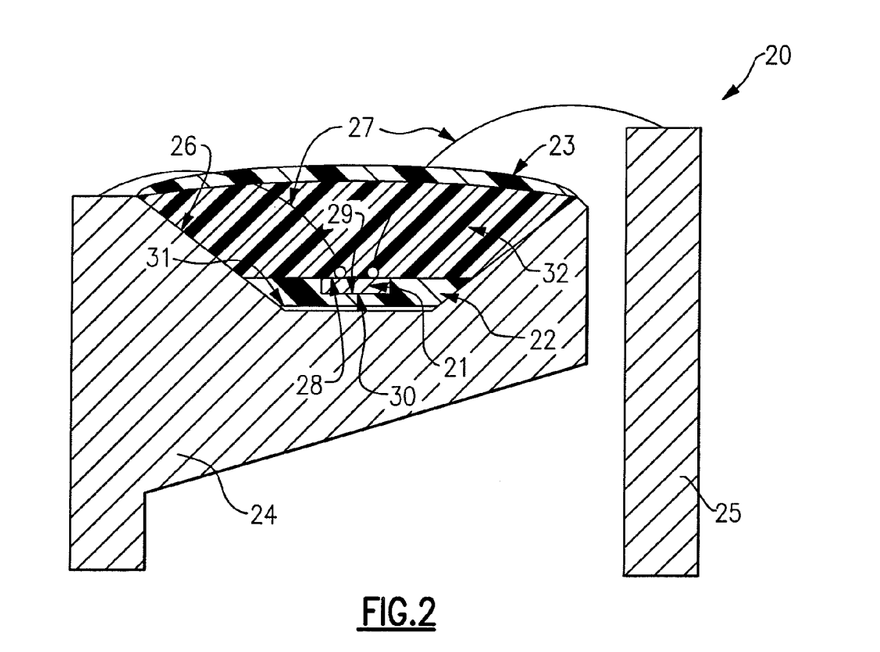
FIG. 2 is a sectional view of a representative example of an embodiment according to the present invention.

FIG. 2 is a sectional view of a representative example of an embodiment according to the present invention. Referring to FIG. 2, there is shown a lighting device 20 comprising a first LED chip 21 (in this case, a lateral, i.e., non-vertical, chip), a first lumiphor 22, a second lumiphor 23, a leadframe which comprises a first lead 24 and a second lead 25. The first lead 24 includes a reflective cup 26. A first wire 27 connects the first lead 24 to a first region of the LED chip 21, and a second wire 28 connects the second lead 25 to a second region of the LED chip 21.

The first LED chip 21 has a first LED chip first surface 28 and a first LED chip second surface 29, the first LED chip first surface 28 and the first LED chip second surface 29 being on opposite sides of the first LED chip 21.

The first lumiphor 22 comprises a first lumiphor first surface 30 and a first lumiphor second surface 31, the first lumiphor first surface 30 and the first lumiphor second surface 31 being on opposite sides of the first lumiphor 22.

The first LED chip first surface 28 faces the second lumiphor 23,

The first LED chip second surface 29 faces and is in contact with (i.e., in direct contact with) the first lumiphor first surface 30.

The first lumiphor second surface 31 is in contact with (i.e., in direct contact with) the reflective cup 26.

As shown in FIG. 2, the second lumiphor 23 is spaced from the first LED chip first surface 28.

The embodiment depicted in FIG. 2 further comprises a clear fill region 32.

The first lumiphor 22 is thus positioned between the first LED chip 21 and the reflective cup 26.

Figure 3:
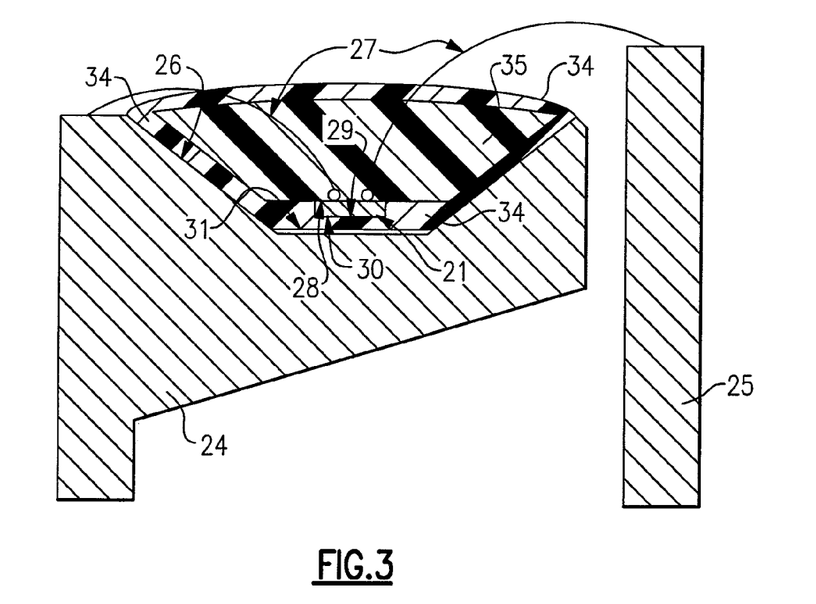
FIG. 3 is a sectional view of a representative example of a second embodiment according to the present invention.

FIG. 3 is a sectional view of a representative example of a second embodiment according to the present invention. The lighting device 33 depicted in FIG. 3 is similar to the lighting device 20 depicted in FIG. 2, except that:

the shape of the first lumiphor 34 in the device in FIG. 3 differs from the shape of the first lumiphor 22 in the device in FIG. 2;

the shape of the clear fill region 35 in the device in FIG. 3 differs from the shape of the clear fill region 32 in the device in FIG. 2; and the device in FIG. 3 does not include a second lumiphor (the device in FIG. 2 includes a second lumiphor 23).

Other elements are similar, and like elements are identified with like reference numbers. Referring to FIG. 3, the first lumiphor 34 surrounds the first LED chip 21. The first LED chip first surface 28 faces a first region of the first lumiphor 34 and the first LED chip second surface 29 faces a second region of the first lumiphor 34.

Figure 4:
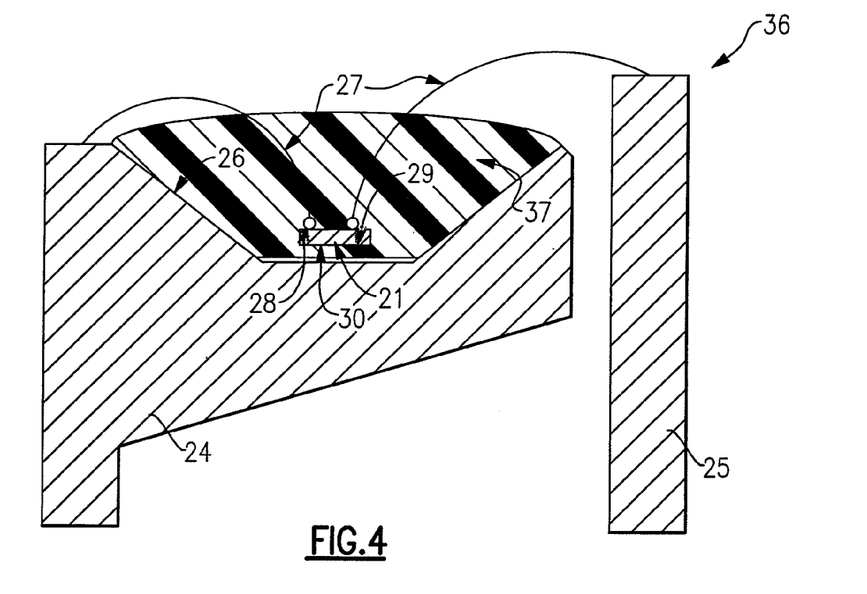
FIG. 4 is a sectional view of a representative example of a third embodiment according to the present invention.

FIG. 4 is a sectional view of a representative example of a third embodiment according to the present invention. The lighting device 36 depicted in FIG. 4 is similar to the lighting device 20 depicted in FIG. 2, except that:

the shape of the first lumiphor 37 in the device in FIG. 4 differs from the shape of the first lumiphor 22 in the device in FIG. 2; and the device in FIG. 4 does not include a second lumiphor (the device in FIG. 2 includes a second lumiphor 23) or a clear fill region (the device in FIG. 2 includes a clear fill region 32).

Other elements are similar, and like elements are identified with like reference numbers. Referring to FIG. 4, the first lumiphor 37 surrounds the first LED chip 21, which is embedded in the first lumiphor 37. The first LED chip first surface 28 faces a first region of the first lumiphor 37 and the first LED chip second surface 29 faces a second region of the first lumiphor 37.

Comparative testing was conducted, comparing the efficacy of a first Example of a lighting device (according to the present invention) with a first Comparative Example of a lighting device.

The first Example of a lighting device was constructed as depicted in FIG. 2. The first LED chip was a lateral 5 mm blue chip (TG chip), the first lumiphor contained luminescent material in an amount of about 10 percent by weight, and the second lumiphor contained luminescent material in an amount of about 25 percent by weight.

The first Comparative Example of a lighting device was constructed as depicted in FIG. 1. The first LED chip was a 5 mm vertical blue chip, and the lumiphor contained luminescent material in an amount of about 7 percent by weight.

Energy (about 30 mA×about 3.15 volts–about 63 mW input power) was delivered to both devices. It was observed that the lighting device according to the first Example provided an efficacy of about 93 lumens/watt, whereas the lighting device according to the first Comparative Example provided an efficacy of about 72 lumens/watt.

The present invention is further directed to an illuminated enclosure, comprising an enclosed space and at least one lighting device as described herein, wherein the lighting device illuminates at least a portion of the enclosure.

The present invention is further directed to an illuminated surface, comprising a surface and at least one lighting device as described herein, wherein if the lighting device is illuminated, the lighting device would illuminate at least a portion of the surface.

The present invention is further directed to an illuminated area, comprising at least one item selected from among the group consisting of a swimming pool, a room, a warehouse, an indicator, a road, a vehicle, a road sign, a billboard, a ship, a boat, an aircraft, a stadium, a toy, a computer, a remote audio device, a remote video device, a cell phone, a tree, a window, and a lamppost, having mounted therein or thereon at least one lighting device as described herein.

Any two or more structural parts of the lighting devices described herein can be integrated. Any structural part of the lighting devices described herein can be provided in two or more parts. Similarly, any two or more functions can be conducted simultaneously, and/or any function can be conducted in a series of steps.

Furthermore, while certain embodiments of the present invention have been illustrated with reference to specific combinations of elements, various other combinations may also be provided without departing from the teachings of the present invention. Thus, the present invention should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

The invention claimed is:

1. A lighting device comprising:
   at least a first solid state light emitter;
   at least a first reflective cup;
   at least first and second lumiphors;
   at least a first transparent structure,
   a first surface of the first lumiphor and a first surface of the first solid state light emitter coplanar,
   a first portion of the first lumiphor in a plane that is perpendicular to the axis of the first reflective cup and that includes a portion of the first solid state light emitter that is farthest from the first reflective cup,
   at least a second portion of the first lumiphor between the first solid state light emitter and the first reflective cup such that the first solid state light emitter is not in direct contact with the first reflective cup, and
   light emitted by the first solid state light emitter that exits the lighting device passes through the second lumiphor.

2. A lighting device as recited in claim 1, wherein the first transparent structure, the first lumiphor and the first solid state light emitter in combination fill the first reflective cup.

3. A lighting device as recited in claim 1, wherein the first transparent structure covers the first solid state light emitter, so that any light exiting the first reflective cup must pass through the first transparent structure.

4. A lighting device as recited in claim 1, wherein the first solid state light emitter comprises a light emitting diode.

5. A lighting device as recited in claim 1, wherein the first lumiphor comprises a binder material and at least one luminescent material dispersed in the binder material.

6. A lighting device as recited in claim 1, wherein the first reflective cup comprises a cup bottom surface and a cup sidewall, and the first lumiphor completely covers the cup bottom surface.

7. A lighting device as recited in claim 1, wherein the first transparent structure at least partially covers the first solid state light emitter.

8. A lighting device comprising:
   at least a first solid state light emitter;
   at least a first reflective cup;
   at least first and second lumiphors;
   at least a first transparent structure,
   a first surface of the first lumiphor and a first surface of the solid state light emitter coplanar,
   a first portion of the first lumiphor in a plane that is perpendicular to the axis of the first reflective cup and that includes a portion of the first solid state light emitter that is farthest from the first reflective cup, and
   at least a second portion of the first lumiphor between the first solid state light emitter and the first reflective cup such that the first solid state light emitter is not in direct contact with the first reflective cup,
   the second lumiphor at least partially covering the first transparent structure.

9. A lighting device as recited in claim 8, wherein the second lumiphor completely covers the first transparent structure.

10. A lighting device comprising:
    at least a first solid state light emitter;
    at least a first reflective cup;
    at least first and second lumiphors; and
    at least a first transparent region,
    the first reflective cup comprising a bottom wall and at least one sidewall,
    a surface of the first lumiphor in contact with a surface of the first solid state light emitter that faces the bottom wall of the first reflective cup,
    at least a first portion of the first lumiphor between the first solid state light emitter and the bottom wall of the first reflective cup and in a plane that is perpendicular to an axis of the first reflective cup and that includes a portion of the first solid state light emitter that is closest to the first reflective cup, at least a second portion of the first lumiphor in a plane that is perpendicular to the axis of the first reflective cup and that includes a portion of the first solid state light emitter that is farthest from the first reflective cup, and
    at least a portion of the second lumiphor in contact with the first reflective cup.

11. A lighting device as recited in claim 10, wherein the first transparent region, the first lumiphor and the first solid state light emitter in combination fill the first reflective cup.

12. A lighting device as recited in claim 10, wherein the first transparent region covers the first solid state light emitter, so that any light exiting the first reflective cup must pass through the first transparent region.

13. A lighting device as recited in claim 10, wherein the first solid state light emitter comprises a light emitting diode.

14. A lighting device as recited in claim 10, wherein the first lumiphor comprises a binder material and at least one luminescent material dispersed in the binder material.

15. A lighting device as recited in claim 10, wherein the first reflective cup comprises a cup bottom surface and a cup sidewall, and the first lumiphor completely covers the cup bottom surface.

16. A lighting device as recited in claim 10, wherein the second lumiphor at least partially covers the first transparent region.

17. A lighting device as recited in claim 10, wherein the second lumiphor completely covers the first transparent region.

18. A lighting device as recited in claim 10, wherein the first transparent region at least partially covers the first solid state light emitter.

19. A lighting device comprising:
    at least a first solid state light emitter;
    at least a first reflective cup, the first reflective cup comprising a bottom and at least one side wall, the at least one side wall comprising at least one edge that is farthest from the bottom;
    at least first and second lumiphors,
    at least one electrical conductor; and
    at least a first transparent region,
    a region, defined by (a) the bottom, (b) the at least one side wall and (c) a plane defined by the at least one edge, is substantially completely filled by the at least a first solid state light emitter, the first lumiphor and the at least a first transparent region, the at least a first transparent region devoid of any air pockets, the region substantially devoid of any elements other than the at least a first solid state light emitter, the first lumiphor, the at least one electrical conductor and the at least a first transparent region, at least a portion of the first lumiphor between the first solid state light emitter and the bottom of the first reflective cup, and light emitted by the first solid state light emitter that exits the i kiting device passes through the second lumiphor.

20. A lighting device as recited in claim 19, wherein the first transparent region, the first lumiphor and the first solid state light emitter in combination fill the first reflective cup.

21. A lighting device as recited in claim 19, wherein the first transparent region covers the first solid state light emitter, so that any light exiting the first reflective cup must pass through the first transparent region.

22. A lighting device as recited in claim 19, wherein the first reflective cup comprises a cup bottom surface and a cup sidewall, and the first lumiphor completely covers the cup bottom surface.

23. A lighting device as recited in claim 19, wherein the first transparent region at least partially covers the first solid state light emitter.

24. A lighting device comprising:
- at least a first solid state light emitter;
- at least a first reflective cup, the first reflective cup comprising a bottom and at least one side wall, the at least one side wall comprising at least one edge that is farthest from the bottom;
- at least first and second lumiphors,
- at least one electrical conductor; and
- at least a first transparent region,
- a region, defined by (a) the bottom, (b) the at least one side wall and (c) a plane defined by the at least one edge, is substantially completely filled by the at least a first solid state light emitter, the first lumiphor and the at least a first transparent region, the region substantially devoid of any elements other than the at least a first solid state light emitter, the first lumiphor, the at least one electrical conductor and the at least a first transparent region,
- at least a portion of the first lumiphor between the first solid state light emitter, and the bottom of the first reflective cup, the second lumiphor at least partially covering the first transparent region.

25. A lighting device comprising:
- at least a first solid state light emitter;
- at least a first reflective cup, the first reflective cup comprising a bottom and at least one side wall, the at least one side wall comprising at least one edge that is farthest from the bottom;
- at least first and second lumiphors; and
- at least a first transparent region, the at least a first transparent region non-gaseous,
- a region, defined by (a) the bottom, (b) the at least one side wall and (c) a plane defined by the at least one edge, is substantially completely filled by the at least a first solid state light emitter, the first lumiphor and the at least a first transparent region, the region substantially devoid of any elements other than the at least a first solid state light emitter, the first lumiphor and the at least a first transparent region,
- at least a portion of the first lumiphor between the first solid state light emitter and the bottom of the first reflective cup, and
- light emitted by the first solid state light emitter that exits the lighting device passes through the second lumiphor.

* * * * *

UNITED STATES PATENT AND TRADEMARK OFFICE
CERTIFICATE OF CORRECTION

| | | |
|---|---|---|
| PATENT NO. | : 8,994,045 B2 | Page 1 of 1 |
| APPLICATION NO. | : 11/870679 | |
| DATED | : March 31, 2015 | |
| INVENTOR(S) | : Negley | |

It is certified that error appears in the above-identified patent and that said Letters Patent is hereby corrected as shown below:

In the Claims

Claim 8, Col. 19, Lines 53-54

Delete "a first surface of the first lumiphor and a first surface of the solid state light emitter coplanar," insert -- a first surface of the first lumiphor and a first surface of the first solid state light emitter coplanar --

Claim 19, Col. 21, Line 5

Delete "the i kiting device passes through the second lumiphor." insert -- the lighting device passes through the second lumiphor. --

Claim 24, Col. 22, Line 6

Delete "state light emitter, and the bottom of the first reflective" insert -- state light emitter and the bottom of the first reflective --

Signed and Sealed this
First Day of September, 2015

Michelle K. Lee
*Director of the United States Patent and Trademark Office*